(12) United States Patent
Shin et al.

(10) Patent No.: US 6,331,955 B1
(45) Date of Patent: Dec. 18, 2001

(54) SEMICONDUCTOR MEMORY DEVICE

(75) Inventors: Deok-Joon Shin, Seoul; Young-Tae Kim, Suwon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/662,102

(22) Filed: Sep. 14, 2000

(30) Foreign Application Priority Data

Sep. 9, 1999 (KR) .................................................. 99-38435

(51) Int. Cl.⁷ ...................................................... G11C 7/00
(52) U.S. Cl. ................................ 365/189.05; 365/230.03; 365/63
(58) Field of Search .................... 365/189.05, 230.03, 365/51, 63, 230.08, 185.11

(56) References Cited

U.S. PATENT DOCUMENTS

| | | | |
|---|---|---|---|
| 4,050,061 | * 9/1977 | Kitagawa | 365/205 |
| 5,621,695 | * 4/1997 | Tran | 365/230.03 |
| 6,041,013 | * 3/2000 | Kohno | 365/230.03 |

* cited by examiner

Primary Examiner—David Nelms
Assistant Examiner—Gene N. Auduong
(74) Attorney, Agent, or Firm—Marger Johnson & McCollom, P.C.

(57) ABSTRACT

The present invention discloses a semiconductor memory device. The device comprises a plurality of memory cell array banks; a plurality of data output buffers for buffering and outputting data outputted from each of the plurality of memory cell array banks in response to control signals; a plurality of data output drivers for driving the data outputted from the plurality of data output buffers; and a data output control signal generator for generating the control signals. The plurality of data output buffers are disposed adjacent the data output control signal generator. Accordingly, a read data can be transmitted at a higher speed by reducing the signal line loading difference between output lines of the data output control signal generator and the data output buffers.

5 Claims, 5 Drawing Sheets

SEMICONDUCTOR MEMORY DEVICE

FIELD OF THE INVENTION

The present invention relates to a semiconductor memory device, more particularly, which can transmit data at a high speed by reducing the signal line loading difference between output lines of a data output control signal generator and the data output buffers at the time of a data read operation.

DESCRIPTION OF THE PRIOR ART

A conventional semiconductor memory device includes a data output control signal generator, data output buffers, and data output drivers on a data read path to read data outputted from memory cells.

The data output control signal generator generates control signals KPIPE and KDATA for controlling the data output buffers. The data output buffers latch and output data in response to the pipeline control signal KPIPE, and latch and output the latched data in response to the clock control signal KDATA. The data output drivers output data from the data output buffers to an external bus.

In a conventional semiconductor memory device, signal line loading of output lines of the data output control signal generator is greater than signal line loading of output lines of the data output buffers. In addition, signal lines from the data output control signal generator to the data output buffers are typically longer than those from the data output buffers to the data output drivers, so that the signal line loading of the output lines of the data output control signal generator is much greater than that of the output lines of the data output buffers.

That is, the signal line loading of the output lines of the data output control signal generator has a large value, and its load becomes much greater as the signal lines from the data output control signal generator to the data output drivers become longer. On the contrary, the signal line loading of the output lines of the data output buffers has a small value, and its load becomes relatively smaller than that of the output lines of the data output control signal generator as the signal lines from the data output buffer to the data output driver become shorter.

Accordingly, in the conventional semiconductor memory device, the signal line loading difference between output lines of the data output control signal generator and those of the data output buffers becomes so large that the speed at which the memory device can transmit data is limited.

SUMMARY OF THE INVENTION

An object of the present invention is to provide a semiconductor memory device which can transmit data at a higher speed by reducing the difference of signal line loading according to the length of the signal lines in order to solve the above-mentioned problem of the prior art.

To accomplish the above object of the present invention, the semiconductor memory device includes a plurality of memory cell array blocks; a plurality of sense amplifiers which are respectively coupled to the plurality of memory cell array blocks for amplifying and outputting data outputted from each of the plurality of memory cell array blocks; a plurality of data output buffers for buffering and outputting the data outputted from the plurality of sense amplifiers in response to control signals; a plurality of data output drivers for driving the data outputted from the plurality of data output buffers; and a data output control signal generator for generating the control signals, wherein the plurality of data output buffers are disposed adjacent the data output control signal generator.

Also, to accomplish the above object of the present invention, the semiconductor memory device includes a plurality of memory cell array blocks, a plurality of data output buffers for buffering and outputting data outputted from each of the plurality of memory cell array blocks in response to control signals; a plurality of data output drivers for driving the data outputted from the plurality of data output buffers; and a data output control signal generator for generating the control signals, wherein the plurality of data output buffers are disposed adjacent the data output control signal generator.

The detailed description of the preferred embodiments according to the present invention will be apparent with reference to the attached drawings.

BRIEF DESCRIPTION OF THE ATTACHED DRAWINGS

FIG. 1 a block diagram illustrating one embodiment of a conventional semiconductor memory device.

DESCRIPTION OF THE PREFERRED EMBODIMENTS

Figure 1:
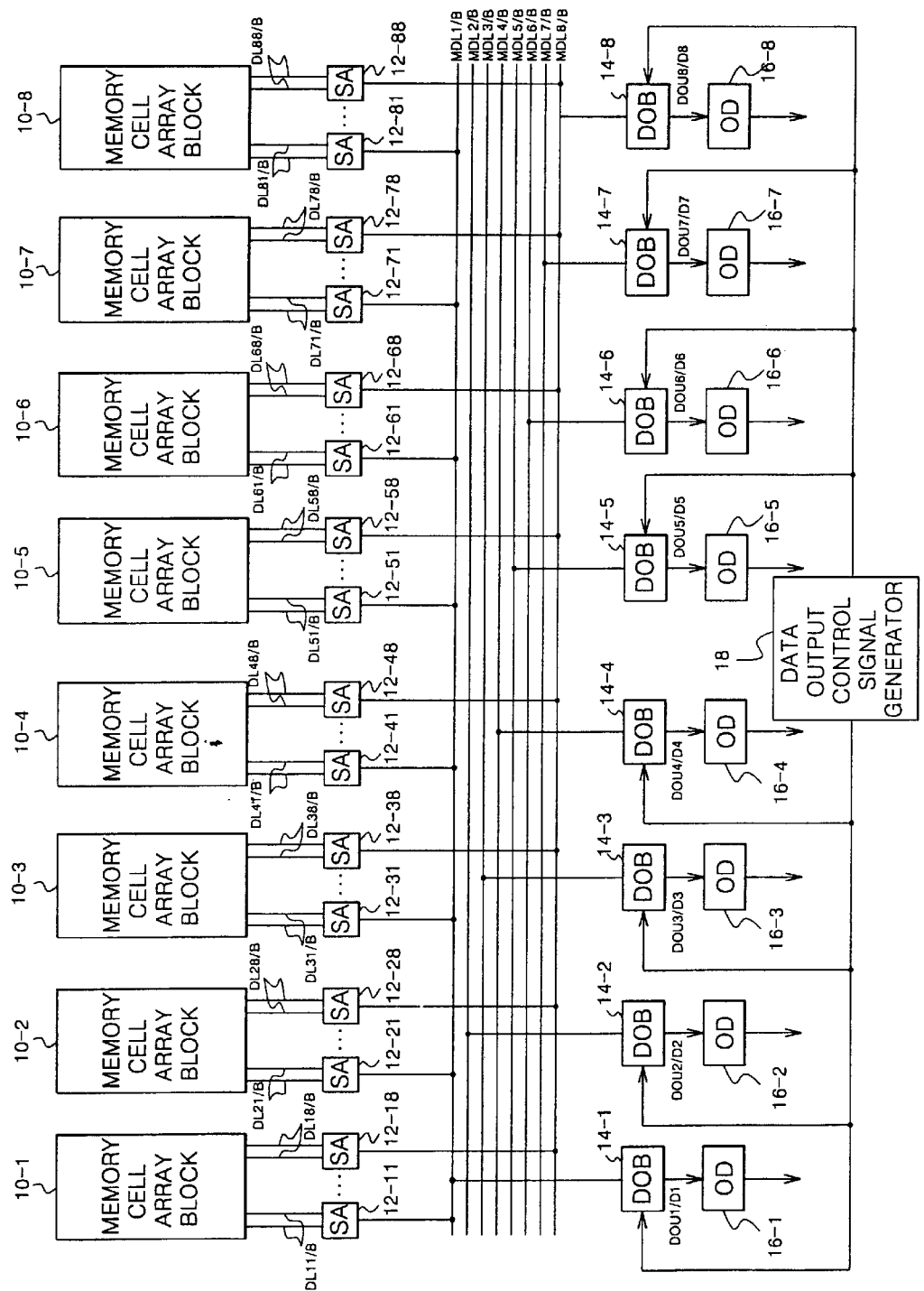

FIG. 1 is a block diagram illustrating one embodiment of a conventional semiconductor memory device, comprising memory cell array blocks 10-1, 10-2, . . . , and 10-8, sense amplifiers(12-11, 12-12, . . . , 12-18), (12-21, 12-22, . . . , 12-28), . . . , and (12-81, 12-82, . . . , 12-88), data output buffers 14-1, 14-2, . . . , and 14-8, data output drivers 16-1, 16-2, and 16-8, and a data output control signal generator 18.

Referring to FIG. 1, SA designates the sense amplifiers, DOB designates the data output buffers, and OD designates the data output drivers. DLxx/B designates a pair of data lines between the memory cell array blocks and the sense amplifiers, and each of memory cell array blocks 10-x is coupled to eight pairs of data lines (DL11/B, DL12/B, DL18/B), (DL21/B, DL22/B, DL28/B), and (DL81/B, DL82/B, . . . DL88/B). MDLx/B designate complimentary pairs of data lines commonly coupled to each of the sense amplifiers(12-11, 12-21, 12-81), (12-12, 12-22, 12-82), . . . (12-18, 12-28, . . . 12-88).

A data read operation will be described below.

When a read command and an address are applied to select one block among eight memory cell array blocks, data is read from the corresponding memory cell array block.

In a case which the memory cell array block 10-1 is selected and eight data bits are outputted to the data line pairs DL11/B, DL12/B, . . . , and DL18/8, the sense amplifiers 12-11, 12-12, . . . , and 12-18 amplify data transmitted from the data line pairs DL11/B, DL12/B, . . . , and DL18/B and convey or transmit the data to main data line pairs MDL11B, MDL2/B, . . . , and MDL8/B. The data output buffers 14-1, 14-2, . . . , and 14-8 buffer data transmitted to the main data line pairs MDL 1/B, MDL2/B, . . . , and MDL8/B, respectively, and output the data to the data output pairs DOU1/D1, DOU2/D2, . . . , and DOU8/D8, respectively. The data output drivers 16-1, 16-2, . . . , and 16-8 drive and output the data output pairs DOU1/D1, DOU2/D2, . . . , and DOU8/D8, respectively, to an external bus.

Figure 2:
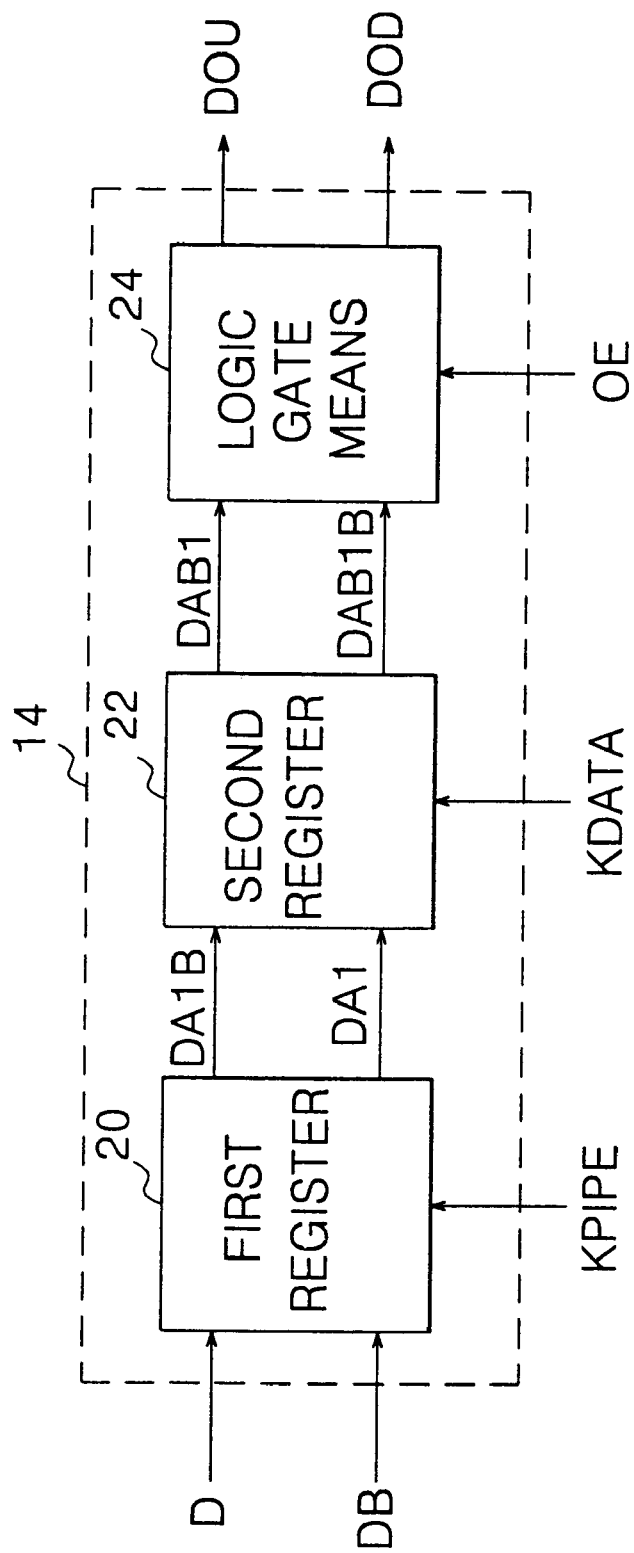
FIG. 2 is a block diagram illustrating the data output buffer shown in FIG. 1.

FIG. 2 is a block diagram illustrating a typical data output buffer (DOB) 14 shown in FIG. 1, comprising a first register 20, a second register 22, and a logic gate means 24.

An operation of the DOB shown in FIG. 2 will be described as below.

A pipeline control signal KPIPE is a signal enabled at the time of operating a pipeline. And a clock control signal KDATA is a signal which is enabled in response to a clock signal at the time of a read operation. An output enable signal OE is a signal which is enabled in response to an output enable signal from an external bus at the time of a read operation.

The first register 20 inputs and latches a data pair D and DB transmitted from a main data line pair MDL/B in response to the control signal KPIPE, and outputs a data pair DA1B and DA1. The second register 22 inputs and latches the data pair DA1B and DA1 in response to the control signal KDATA, and outputs a data pair DAB1 and DAB 1B. The logic gate means 24 generates a data pair DOU and DOD by ANDing the output enable signal OE and the data pair DAB1 and DAB1B.

That is, the data output buffers input and latch data in response to the control signals KPIPE and KDATA outputted from the data output control signal generator 18 (See FIG. 1). But the signal line loading of output lines of the data output control signal generator 18 is so great that the control signals KPIPE and KDATA cannot be transmitted at a high speed.

Figure 3:
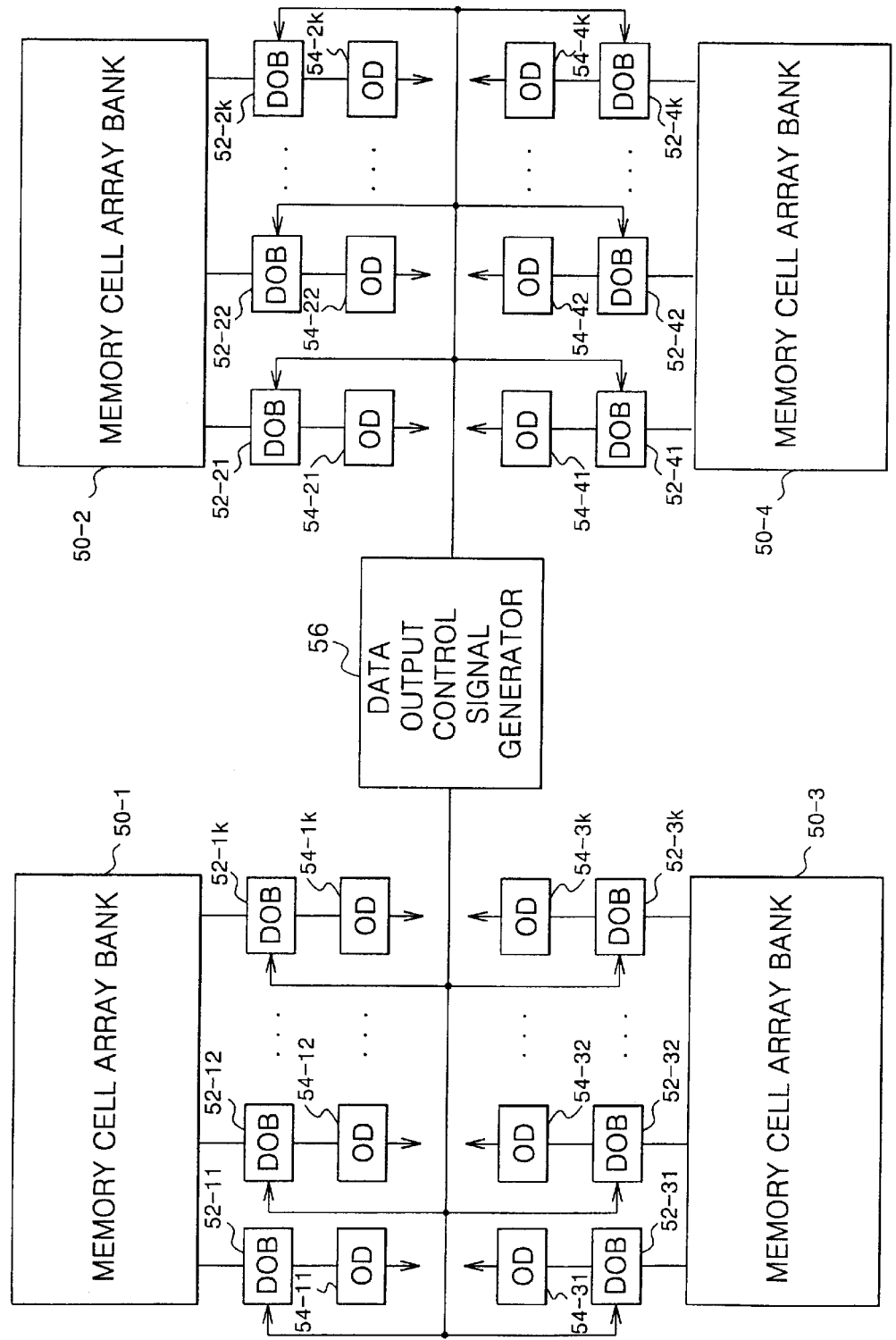
FIG. 3 is a block diagram illustrating another embodiment of a conventional semiconductor memory device.

FIG. 3 is a block diagram illustrating another embodiment of a conventional semiconductor memory device, comprising memory cell array banks 50-1, 50-2, 50-3 and 50-4, data output buffers (52-11, 52-12, . . . , 52-1k), (52-21, 52-22, . . . , 52-2k), (52-31, 52-32, . . . , 52-3k), and (52-41, 52-42, . . . , 52-4k), data output drivers (54-11, 54-12, . . . , 54-1k), (54-21, 54-22, . . . , 54-2k), (54-31, 54-32, . . . , 54-3k), and (54-41, 54-42, . . . , 54-4k), and a data output control signal generator 56.

As shown in FIG. 3, DOB designates the data output buffers and OD designates the data output drivers. And the memory cell array banks 50-1, 50-2, 50-3 and 50-4 include the memory cell array blocks and the sense amplifiers illustrated in FIG. 1.

Referring to FIG. 3, the data output control signal generator 56 is disposed in the center of the memory cell array banks 50-1, 50-2, 50-3 and 50-4, and the data output buffers (52-11, 52-12, . . . , 52-1k), (52-21, 52-22, . . . , 52-2k), (52-31, 52-32, . . . , 52-3k) and (52-41, 52-42, . . . , 52-4k) and the data output drivers (54-11, 54-12, . . . , 54-1k), (54-21, 54-22, . . . , 54-2k), (54-31, 54-32, . . . , 54-3k) and (54-41, 54-42, . . . , 544k) are disposed on output terminals of each memory cell array bank.

A read operation in connection with FIG. 3 can be easily understood with reference to the read operation described above in connection with FIG. 1.

The configuration of signal lines of the semiconductor memory device illustrated in FIG. 3 is similar or identical to that of the semiconductor memory device illustrated in FIG. 1. That is, the length of signal lines from the data output control signal generator 56 to the data output buffers (52-11, 52-12, . . . , 52-1k), (52-21, 52-22, . . . , 52-2k), (52-31, 52-32, . . . , 52-3k) and (52-41, 52-42, . . . , 52-4k) is much longer than that of signal lines from the data output buffers (52-11, 52-12, . . . , 52-1k), (52-21, 52-22, . . . , 52-2k), (52-31, 52-32, . . . , 52-3k) and (52-41, 52-42, . . . , 52-4k) to the data output drivers(54-11, 54-12, . . . , 54-1k), (54-21, 54-22, . . . , 54-2k), (54-31, 54-32, . . . , 54-3k), and (54-41, 54-42, . . . , 54-4k).

As shown in FIG. 1 and FIG. 3, in the conventional semiconductor memory device, the signal line loading of output lines of the data output control signal generator is greater than that of output lines of the data output buffers. In addition, the length of signal lines between the data output control signal generator and the data output buffers is longer than that of signal lines between the data output buffers and the data output drivers.

Accordingly, the signal line loading of output lines of the data output control signal generator becomes greater than that of output lines of the data output buffers so that a read data cannot be accomplished at a very high speed.

Also, the signal line loading of output lines of the data output control signal generator becomes greater and the signal lines from the data output control signal generator to the data output buffers are different from each other so that the control signals KPIPE and KDATA transmitted from the data output control signal generator to the data output buffers are skewed relative to each other.

Figure 4:
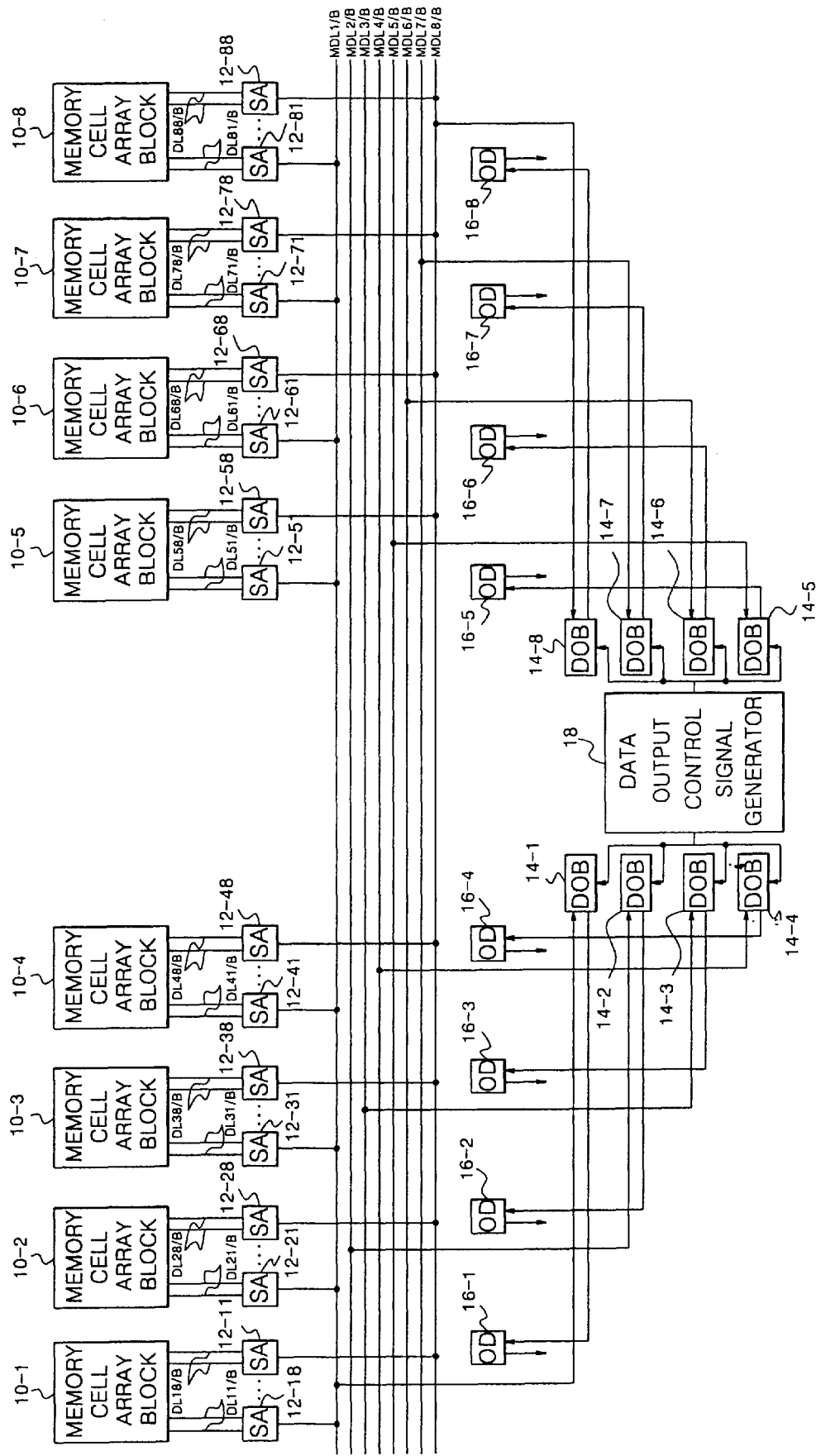
FIG. 4 is a block diagram illustrating one embodiment of a semiconductor memory device according to the present invention.

FIG. 4 is a block diagram illustrating one embodiment of a semiconductor memory device according to the present invention, comprising the same blocks as illustrated in FIG. 1 and indicated by the identical reference numerals.

Differently from the block diagram of FIG. 1, data output buffers(14-1, 14-2, . . . , 14-8) are disposed adjacent a data output control signal generator 18 on the right and left thereof A data read operation of the semiconductor memory device illustrated in FIG. 4 is similar to that of the conventional semiconductor memory device illustrated in FIG. 1.

Figure 5:
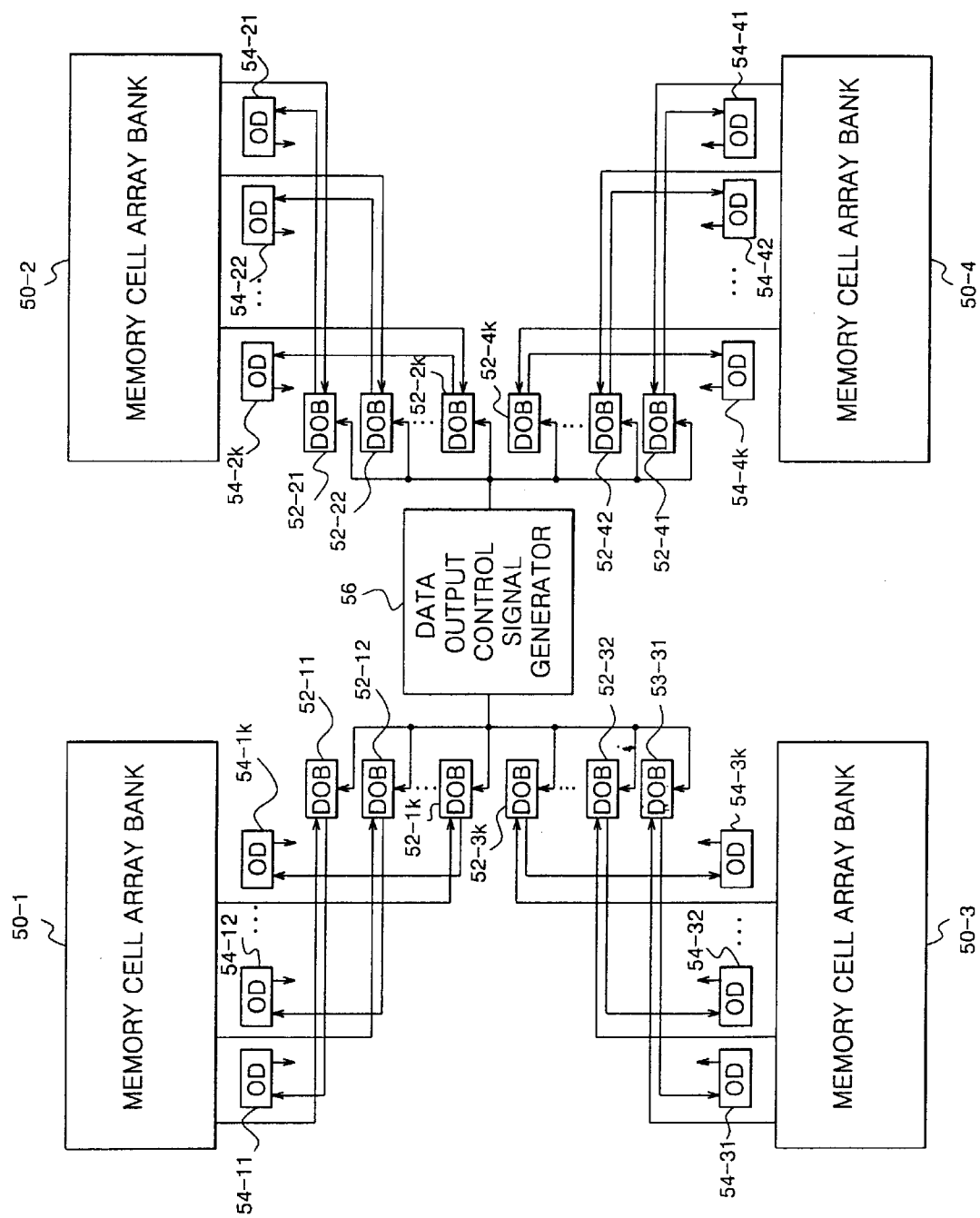
FIG. 5 is a block diagram illustrating another embodiment of a semiconductor memory deuce according to the present invention.

That is, in the semiconductor memory device according to the present invention, the data output buffers 14-1, 14-2, . . . , and 14-8 are disposed adjacently to the data output control signal generator 18 for reducing the signal line loading difference between output lines of the data output control signal generator 18 and those of output lines of the data output buffers 14-1, 14-2, . . . , and 14-8. Accordingly, data read speed is greatly improved. FIG. 5 is a block diagram illustrating another embodiment of a semiconductor memory device according to the present invention, comprising the same blocks as illustrated in FIG. 3 and indicated by the identical reference numerals.

Differently from the block diagram of FIG. 3, data output buffers(52-11, 52-12, . . . , 52-1k), (52-21, 52-22, . . . , 52-2k), (52-31, 52-32, . . . , 52-3k), and (52-41, 52-42, . . . , 52-4k) are disposed adjacent a data output control signal generator 56 in FIG. 5.

As with the embodiment shown in FIG. 4, the length of signal lines between the data output control signal generator 56 and the data output buffers (52-11, 52-12, . . . , 52-1k), (52-21, 52-22, . . . , 52-2k), (52-31, 52-32, . . . , 52-3k), and (52-41, 52-42, . . . , 52-4k) is short, and the length of signal lines between the data output buffers (52-11, 52-12, . . . , 52-1k), (52-21, 52-22, . . . , 52-2k), (52-31, 52-32, . . . , 52-3k) and (52-41, 52-42, . . . , 52-4k) and the data output drivers (54-11, 54-12, . . . , 54-1k), (54-21, 54-22, . . . , 54-2k), (54-31, 54-32, . . . , 54-3k) and (54-41, 54-42, . . . , 54-4k) is long. Accordingly, the line loading difference between the output lines of the data output control signal generator 18 and those of the data output buffers 14-1, 14-2, ..., and 14-8 becomes small so that a read data can be achieved at a very high speed.

That is, in the semiconductor memory device according to the present invention, the data output control signal generator and the data output buffers are disposed adjacent each other regardless of their location in a chip so as to shorten signal lines between them and to relatively lengthen signal lines between the data output buffers and the data output drivers.

Accordingly, the semiconductor memory device of the present invention can transmit data at a higher speed by disposing the data output buffers adjacent the data output control signal generator.

And the device can reduce the skew between control signals transmitted from the data output control signal generator to the data output buffers.

While the present invention has been described in detail with reference to specific embodiments, it will be readily noted by those skilled in this art that various changes and modifications may be achieved without departing from the range of the present invention.

What is claimed is:

1. A semiconductor memory device, comprising:

a plurality of memory cell array blocks;

a plurality of sense amplifiers coupled to said plurality of memory cell array blocks for amplifying and outputting data outputted from said plurality of memory cell array blocks, respectively;

a plurality of data output buffers for buffering and outputting the data outputted from said plurality of sense amplifiers in response to control signals;

a plurality of data output drivers for driving the data outputted from said plurality of data output buffers; and a data output control signal generator for generating said control signals, wherein said plurality of data output buffers are disposed adjacent said data output control signal generator and wherein the length of signal lines between said data output control signal generator and said plurality of data output buffers is shorter than that of signal lines between said plurality of data output buffers and said plurality of data output drivers.

2. The semiconductor memory device as claimed in claim 1, wherein said plurality of data output buffers are disposed to the right and left said data output control signal generator.

3. The semiconductor memory device as claimed in claim 1, wherein each of said plurality of data output buffers comprises:

a first register for inputting and latching an output signal of said sense amplifier in response to a first control signal among said control signals;

a second register for inputting and latching an output signal of said first register in response to a second control signal among said control signals; and a logic gate means for outputting an output signal of said second register in response to an output enable signal.

4. A semiconductor memory device comprising:

a plurality of memory cell array banks;

a plurality of data output buffers for buffering and outputting data outputted from each of said plurality of memory cell array banks in response to control signals;

a plurality of data output drivers for driving the data outputted from said plurality of data output buffers; and a data output control signal generator for generating said control signals, wherein said plurality of data output buffers are disposed adjacently to said data output control signal generator and the length of signal lines between said data output signal generator and said plurality of data output buffers is shorter than that of signal lines between said plurality of data output buffers and said plurality of data output drivers.

5. The semiconductor memory device as claimed in claim 4, wherein said plurality of data output buffers are disposed to the right and left of said data output control signal generator.

* * * * *

UNITED STATES PATENT AND TRADEMARK OFFICE
CERTIFICATE OF CORRECTION

PATENT NO. : 6,331,955 B1 Page 1 of 1
DATED : December 18, 2001
INVENTOR(S) : Deok-Joon Shin and Young-Tae Kim It is certified that error appears in the above-identified patent and that said Letters Patent is hereby corrected as shown below:

Title page,
Item [54], title "SEMICONDUCTOR MEMORY DEVICE" should read
-- HIGH-SPEED SEMICONDUCTOR MEMORY DEVICE HAVING SHORTENED DRIVE SIGNAL LINES BETWEEN DATA OUTPUT SIGNAL GENERATOR AND OUTPUT BUFFERS --.

Column 2,
Line 21, "Fig. 1 a block diagram" should read -- Fig. 1 is a block diagram --.
Line 32, "memory deuce" should read -- memory device --.
Line 44, "data output drivers 16-1, 16-2, and 16-8," should read -- data output drivers 16-1. 16-2, …, 16-8, --.
Line 52, "MDL11B" should read -- MDL1/B --.

Column 3,
Line 1, "MDL 1/B" should read -- MDL1/B --.

Column 4,
Line 48, "Fig. 5 is" should begin a new paragraph.

Signed and Sealed this

Fifteenth Day of October, 2002

Attest:

Attesting Officer

JAMES E. ROGAN
*Director of the United States Patent and Trademark Office*